United States Patent
Isobe

(10) Patent No.: US 9,979,351 B2
(45) Date of Patent: May 22, 2018

(54) DIFFERENTIAL AMPLIFIER CIRCUIT

(71) Applicant: SII Semiconductor Corporation, Chiba-shi, Chiba (JP)

(72) Inventor: Yoshihisa Isobe, Chiba (JP)

(73) Assignee: ABLIC INC., Chiba (JP)

( * ) Notice: Subject to any disclaimer, the term of this patent is extended or adjusted under 35 U.S.C. 154(b) by 0 days. days.

(21) Appl. No.: 15/385,116

(22) Filed: Dec. 20, 2016

(65) Prior Publication Data

US 2017/0187330 A1    Jun. 29, 2017

(30) Foreign Application Priority Data

Dec. 24, 2015    (JP) .................. 2015-252370

(51) Int. Cl.
| | | |
|---|---|---|
| *H03F 3/45* | (2006.01) | |
| *H03F 1/02* | (2006.01) | |
| *H03F 3/30* | (2006.01) | |
| *H03F 3/72* | (2006.01) | |

(52) U.S. Cl.
CPC ......... *H03F 1/0211* (2013.01); *H03F 1/0222* (2013.01); *H03F 3/304* (2013.01); *H03F 3/3035* (2013.01); *H03F 3/45179* (2013.01); *H03F 3/45475* (2013.01); *H03F 3/72* (2013.01); *H03F 3/45* (2013.01); *H03F 3/45183* (2013.01); *H03F 2203/30087* (2013.01); *H03F 2203/30099* (2013.01)

(58) Field of Classification Search
CPC ...... H03F 1/0211; H03F 3/45179; H03F 1/02; H03F 3/45; H03F 3/45183; H03F 3/45188; H03F 3/45475; H03F 2200/261; H03F 2203/45138; H03F 1/307; H03F 3/30; H03F 3/3001; H03F 3/3022
USPC .......................................... 330/69, 253, 255
See application file for complete search history.

(56) References Cited

U.S. PATENT DOCUMENTS

| | | | | |
|---|---|---|---|---|
| 5,285,168 A | * | 2/1994 | Tomatsu | ............... H03F 3/3001 330/253 |
| 8,310,306 B2 | * | 11/2012 | Itoh | ...................... H03F 3/3022 330/255 |

FOREIGN PATENT DOCUMENTS

JP            03-274911 A      12/1991

* cited by examiner

*Primary Examiner* — Khanh V Nguyen
(74) *Attorney, Agent, or Firm* — Brinks Gilson & Lione

(57) ABSTRACT

Provided is a differential amplifier circuit having a low current consumption and a small circuit area. The differential amplifier circuit is formed as a drain grounding circuit (source follower circuit), which includes two stages of output transistors that are connected to two stages of amplifier circuits in series, and is configured to control one of the two output transistors by output from the amplifier circuit in the first stage, and to control another of the two output transistors by output from the amplifier circuit in the second stage.

2 Claims, 2 Drawing Sheets

DIFFERENTIAL AMPLIFIER CIRCUIT

RELATED APPLICATIONS

This application claims priority under 35 U.S.C. § 119 to Japanese Patent Application No. 2015-252370 filed on Dec. 24, 2015, the entire content of which is hereby incorporated by reference.

BACKGROUND OF THE INVENTION

1. Field of the Invention

The present invention relates to a differential amplifier circuit configured to amplify a difference between two input voltages.

2. Description of the Related Art

Differential amplifier circuits are widely used in various electronic devices. In particular, a differential amplifier circuit is able to perform analog signal processing with high accuracy by being applied a negative feedback. Therefore, the differential amplifier circuit has become an essential technology in the development of electronic devices of today.

The differential amplifier circuit has a function of amplifying a difference between two input voltages, and is constantly being required to have a lower current consumption, a smaller size, and a lighter weight, as represented by mobile electronic devices driven by batteries.

In FIG. 3, a related-art differential amplifier circuit is illustrated. The related-art differential amplifier circuit includes an amplifier circuit 1 in a first stage, which is configured to amplify a voltage difference between two input terminals IP and IN, amplifier circuits 2 and 6 in a second stage, which are configured to amplify a voltage difference between output terminals OP and ON of the amplifier circuit 1, an output transistor 7 of a PMOS transistor that has a gate controlled by output GH of the amplifier circuit 2, and an output transistor 3 of an NMOS transistor controlled by output GL of the amplifier circuit 6.

In the differential amplifier circuit as described above, the output transistors 3 and 7 are arranged to attain low impedance at an output terminal OUT. Further, the amplifier circuits 2 and 6 are arranged in the second stage to facilitate setting of a bias for operation of the output transistors 3 and 7.

However, the differential amplifier circuit described above includes three amplifier circuits, and thus has a downside in that the current consumption and a circuit area are increased.

SUMMARY OF THE INVENTION

The present invention has been made in order to solve the above-mentioned problem, and provides a differential amplifier circuit having a low current consumption and a small circuit area.

In order to solve the problem in the related art, a differential amplifier circuit according to one embodiment of the present invention has the following configuration.

The differential amplifier circuit is formed as a drain grounding circuit (source follower circuit), which includes two stages of output transistors that are connected to two stages of amplifier circuits in series, and is configured to control one of the two output transistors by output from the amplifier circuit in the first stage, and to control another of the two output transistors by output from the amplifier circuit in the second stage.

According to the differential amplifier circuit of the present invention, by controlling one of the two output transistors by the output from the amplifier circuit in the first stage, one amplifier circuit can be omitted. As a result, there is an effect that the current consumption and the circuit area can be reduced without impairing low output impedance and facility of setting a bias for operation of the output transistors.

Further, by forming the output transistor controlled by the output from the amplifier circuit in the second stage as the drain grounding circuit, a voltage amplification gain is suppressed. As a result, there is an effect that a phase compensation circuit required when the differential amplifier circuit is used by being applied a negative feedback can be omitted.

DETAILED DESCRIPTION OF THE PREFERRED EMBODIMENTS

Figure 1:
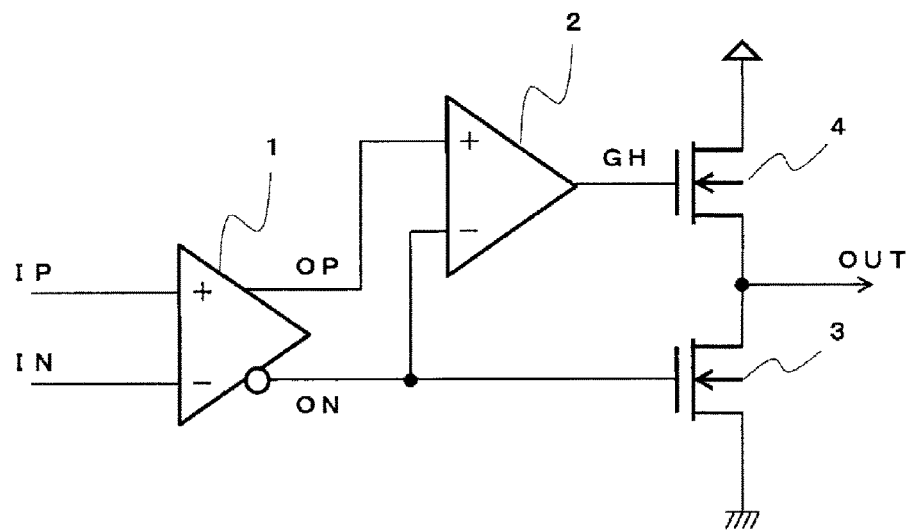
FIG. 1 is a circuit diagram of a differential amplifier circuit of an embodiment of the present invention.

FIG. 1 is a circuit diagram of a differential amplifier circuit of an embodiment of the present invention.

The differential amplifier circuit of this embodiment includes an amplifier circuit 1, an amplifier circuit 2, and output transistors 3 and 4 of NMOS transistors.

The amplifier circuit 1 has two input terminals connected to input terminals IP and IN of the differential amplifier circuit, and is configured to output a voltage, which is obtained by amplifying a voltage difference between the two input terminals, as a voltage difference between an output terminal OP and an output terminal ON. The amplifier circuit 2 has two input terminals connected to the output terminals OP and ON of the amplifier circuit 1, and is configured to output a voltage, which is obtained by amplifying the voltage difference between the output terminal OP and the output terminal ON, to an output terminal GH. The output transistor 3 has a gate connected to the output terminal ON of the amplifier circuit 1, a source connected to a ground, and a drain connected to the output terminal OUT. The output transistor 4 has a gate connected to the output terminal GH of the amplifier circuit 2, a drain connected to a power source terminal, and a source connected to the output terminal OUT.

The circuit of FIG. 1 as described above forms a differential amplifier circuit configured to output a voltage, which is obtained by amplifying a voltage difference between the input terminals IP and IN, to the output terminal OUT.

Next, operation of the differential amplifier circuit of this embodiment is described.

When the voltage difference between the input terminals IP and IN of the differential amplifier circuit is positive, a potential difference between the output terminal OP and the output terminal ON of the amplifier circuit 1 becomes positive. Then, a voltage at the output terminal OP approaches a power source voltage, and a voltage at the output terminal ON approaches a ground voltage. As a result, a gate voltage of the output transistor 3 is decreased, and thus a current drivability thereof is decreased. When the potential difference between the output terminal OP and the output terminal ON is positive, a voltage at the output terminal GH of the amplifier circuit 2 approaches the power source voltage. As a result, a gate voltage of the output transistor 4 is increased, and thus the current drivability thereof is increased. Therefore, the differential amplifier circuit outputs a high voltage, which corresponds to the voltage difference between the input terminals IP and IN, to the output terminal OUT.

When the voltage difference between the input terminals IP and IN of the differential amplifier circuit is negative, the potential difference between the output terminal OP and the output terminal ON of the amplifier circuit 1 becomes negative. Then, the voltage at the output terminal OP approaches the ground voltage, and the voltage at the output terminal ON approaches the power source voltage. As a result, the gate voltage of the output transistor 3 is increased, and thus the current drivability thereof is increased. When the potential difference between the output terminal OP and the output terminal ON is negative, the voltage at the output terminal GH of the amplifier circuit 2 approaches the ground voltage. As a result, the gate voltage of the output transistor 4 is decreased, and thus the current drivability thereof is decreased. Therefore, the differential amplifier circuit outputs a low voltage, which corresponds to the voltage difference between the input terminals IP and IN, to the output terminal OUT.

Here, the voltage difference between the output terminal OP and the output terminal ON of the amplifier circuit 1 equals the voltage difference between the input terminal IP and the input terminal IN multiplied by a differential gain of the amplifier circuit 1. Further, a voltage change of the output terminal ON equals the voltage difference between the input terminal IP and the input terminal IN multiplied by a single phase gain of the amplifier circuit 1. A voltage change of the output terminal GH of the amplifier circuit 2 equals the voltage difference between the output terminal OP and the output terminal ON of the amplifier circuit 1 multiplied by a gain of the amplifier circuit 2. Further, the output transistor 3 forms a source grounding amplifier circuit, and is configured to exert an amplifying effect on the voltage change of the output terminal ON of the amplifier circuit 1.

An absolute value of a voltage change amount of the output terminal OP and that of the output terminal ON of the amplifier circuit 1 do not necessarily need to be equal to each other, and the voltage change amount of the output terminal OP may be 0.

As described above, the circuit of FIG. 1 functions as the differential amplifier circuit configured to output the voltage, which is obtained by amplifying the voltage difference between the input terminal IP and the input terminal IN, to the output terminal OUT.

As described above, the differential amplifier circuit of this embodiment has a configuration in which the gate of the output transistor 3 is connected to the output terminal ON of the amplifier circuit 1. As a result, one amplifier circuit can be omitted, and thus the current consumption and the circuit area can be reduced compared to the related art.

Further, the output transistor 4 having the gate connected to the output terminal GH of the amplifier circuit 2 serves as a drain grounding circuit to suppress a gain of the output transistor 4. As a result, a phase compensation circuit required when the differential amplifier circuit is used by being applied a negative feedback can be omitted as compared to the related art. A negative feedback circuit and the phase compensation circuit are generally well known to those skilled in the art and are therefore not illustrated in the drawings.

Figure 2:
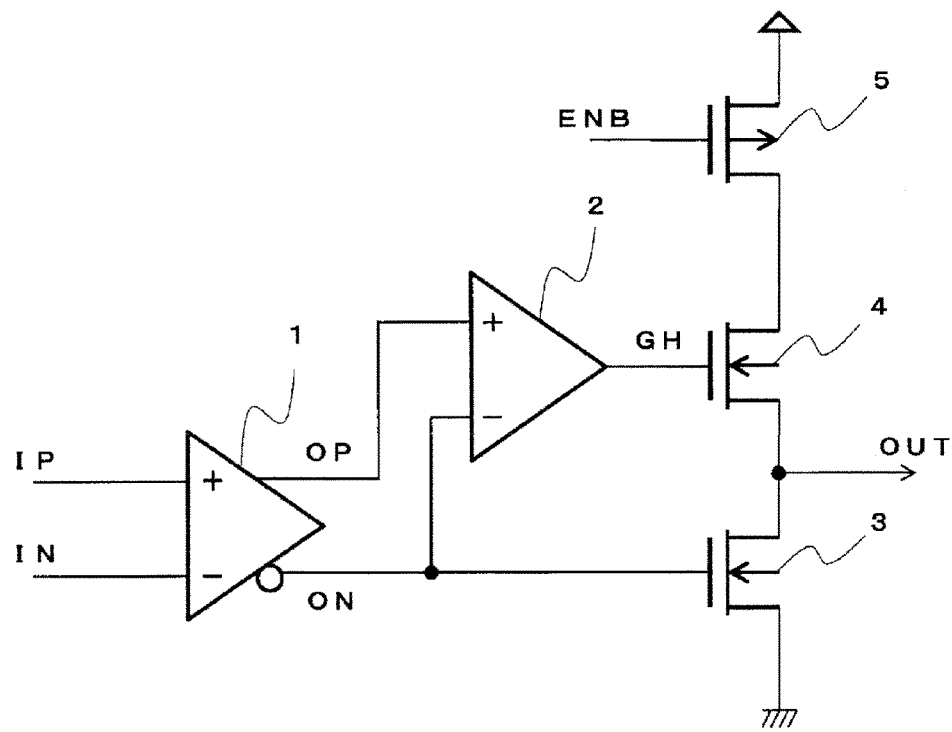
FIG. 2 is a circuit diagram for illustrating another example of the differential amplifier circuit of the embodiment.
Figure 3:
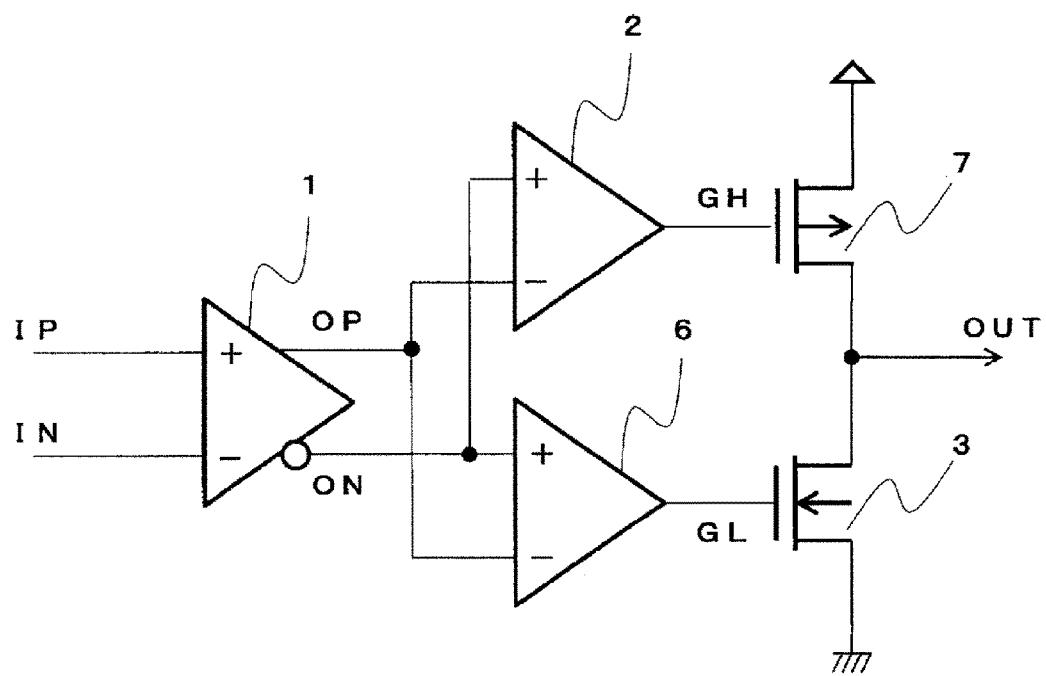
FIG. 3 is a circuit diagram of a related-art differential amplifier circuit.

FIG. 2 is a circuit diagram for illustrating another example of the differential amplifier circuit according to this embodiment. When compared to the differential amplifier circuit of FIG. 1, the differential amplifier circuit of FIG. 2 additionally includes a PMOS transistor 5.

The PMOS transistor 5 has a gate connected to a control signal terminal ENB, a source connected to the power source terminal, and a drain connected to the drain of the output transistor 4.

The PMOS transistor 5 functions as a switch that is placed into an ON state when the control signal terminal ENB is the ground voltage, and is placed into an OFF state when the control signal terminal ENB is the power source voltage.

In the differential amplifier circuit, when the output terminal GH of the amplifier circuit 2 is the ground voltage, and the output transistor 4 is in the OFF state, leakage current referred to as off leakage current may flow through the output transistor 4. This becomes more conspicuous when a threshold voltage of the output transistor 4 is lowered to bring the output voltage of the output terminal OUT closer to the power source voltage.

In the differential amplifier circuit of this embodiment, under a situation in which the leakage current flows through the output transistor 4, the control signal ENB may serve as the power source voltage and the PMOS transistor 5 may be placed in the OFF state, to thereby suppress the leakage current.

In general, a size of the PMOS transistor 5 is easily set to a size in which an ON resistance is sufficiently small in the ON state, and the leakage current is sufficiently small in the OFF state.

As described above, the differential amplifier circuit of this embodiment has a configuration in which the output transistor 4 is connected to the power source terminal via the PMOS transistor 5 configured to function as a switch. Therefore, the leakage current when the output transistor 4 is in the OFF state can be suppressed, and the current consumption can be reduced.

It is apparent that in the differential amplifier circuit of this embodiment, the same effect can be obtained when the output transistor 4 is a PMOS transistor connected to the output of the amplifier circuit 1, the output transistor 3 is a PMOS transistor connected to the output of the amplifier circuit 2, and the transistor 5 is an NMOS transistor configured to function as a switch and arranged between the output transistor 3 and the ground.

What is claimed is:
1. A differential amplifier circuit, which is configured to amplify a difference between a first input voltage and a second input voltage, the differential amplifier circuit comprising:
   a first amplifier circuit configured to amplify the difference between the first input voltage and the second input voltage, and to output the amplified difference as a difference between a first output voltage and a second output voltage;
   a second amplifier circuit configured to further amplify the difference between the first output voltage and the second output voltage that is output from the first amplifier circuit; and
   a first output transistor and a second output transistor, which are connected in series, the first output transistor including a gate to which the first output voltage is input, a source connected to a second power source terminal, and a drain connected to an output terminal, the second output transistor including a gate to which a voltage output from the second amplifier circuit is input, a source connected to the output terminal, and a drain connected to a first power source terminal.

2. The differential amplifier circuit according to claim 1, wherein the drain of the second output transistor is connected to the first power source terminal via a transistor configured to function as a switch.

* * * * *